(12) United States Patent
Yamashita et al.

(10) Patent No.: US 11,296,261 B2
(45) Date of Patent: Apr. 5, 2022

(54) LIGHT-EMITTING DEVICE

(71) Applicant: STANLEY ELECTRIC CO., LTD., Tokyo (JP)

(72) Inventors: Yusuke Yamashita, Tokyo (JP); Yasuhiro Ono, Tokyo (JP); Yoichi Shimoda, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/902,917

(22) Filed: Jun. 16, 2020

(65) Prior Publication Data

US 2020/0403127 A1  Dec. 24, 2020

(30) Foreign Application Priority Data

Jun. 18, 2019 (JP) .............................. JP2019-112524

(51) Int. Cl.
*H01L 33/50* (2010.01)
*H01L 33/52* (2010.01)

(52) U.S. Cl.
CPC ............ *H01L 33/502* (2013.01); *H01L 33/52* (2013.01)

(58) Field of Classification Search
CPC .............................. H01L 33/502; H01L 33/52
See application file for complete search history.

(56) References Cited

U.S. PATENT DOCUMENTS

| 2009/0256166 A1* | 10/2009 | Koike | H01L 33/56 257/98 |
| 2011/0193106 A1* | 8/2011 | Lerman | F21K 9/64 257/88 |
| 2017/0062677 A1* | 3/2017 | Okubo | H01L 33/56 |

FOREIGN PATENT DOCUMENTS

JP        2010-219324 A        9/2010

* cited by examiner

*Primary Examiner* — Jay C Chang
*Assistant Examiner* — Mikka Liu
(74) *Attorney, Agent, or Firm* — Kenealy Vaidya LLP

(57) ABSTRACT

A light-emitting device includes a substrate, an electrode, a light-emitting element, a variable light absorbing layer, and a sealing body. The electrode is formed on the substrate. The light-emitting element is disposed on the substrate and electrically connected to the electrode. The variable light absorbing layer is formed so as to cover the electrode on the substrate. The variable light absorbing layer contains a plurality of metal oxide particles that change a light absorption property by irradiation with an ultraviolet light. The sealing body is formed on the substrate so as to seal the light-emitting element. The sealing body has translucency to a light emitted from the light-emitting element.

10 Claims, 8 Drawing Sheets

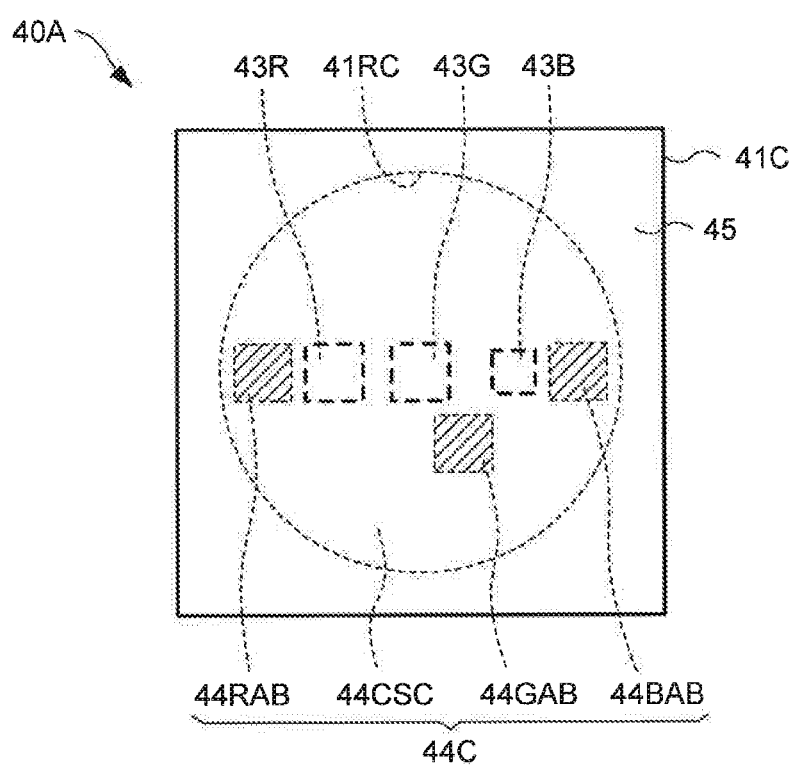

LIGHT-EMITTING DEVICE

BACKGROUND OF THE INVENTION

1. Field of the Invention

The present invention relates to a light-emitting device that includes a light-emitting element, such as a light-emitting diode.

2. Description of the Related Art

There has been conventionally known a light-emitting device that includes a light-emitting element, such as a light-emitting diode. For example, JP-A-2010-219324 discloses a light-emitting device including a light-emitting element and a light-transmitting member that transmits light emitted from this light-emitting element.

SUMMARY OF THE INVENTION

The light-emitting element to which power is fed performs a light-emitting operation. The light-emitting device includes, for example, electrodes and wiring for the power feeding to the light-emitting element. Further, the light-emitting device includes, for example, functional elements, such as a resistor and a capacitor, in addition to the light-emitting element. The light-emitting device in a state where these various kinds of elements and wiring are protected and sealed is mounted to various kinds of apparatuses and systems using this light-emitting device.

Such a light-emitting device is preferably less likely to be deteriorated even operated under various kinds of severe environments, such as use in outdoor. For example, the functional elements and the electrodes are preferred to be sufficiently protected so as to maintain stable electric property and optical property over a long period even exposed under an external atmosphere.

The optical property required for the light-emitting device, for example, a range of a required optical output, differs depending on its application and a customer. Further, even when the device is designed so as to meet this required optical property, due to another factor, such as an allowable error in a manufacturing process, individuals not meeting this optical property are manufactured in some cases.

However, it is often difficult to change the light-emitting element and the other functional elements of the light-emitting device, for example, after mounting, for example, after sealing. Therefore, for example, it is often difficult to adjust the light-emitting device having the optical property out of a pass range in inspection on a completed product so that the optical property is in the pass range after this inspection or to change the optical property of the light-emitting device by the customer.

The present invention has been made in consideration of the above-described points, and its object is to provide a light-emitting device that allows easily adjusting an optical property after mounting and features high quality and long life.

A light-emitting device according to the present invention includes a substrate, an electrode, a light-emitting element, a variable light absorbing layer, and a sealing body. The electrode is formed on the substrate. The light-emitting element is disposed on the substrate and electrically connected to the electrode. The variable light absorbing layer is formed so as to cover the electrode on the substrate. The variable light absorbing layer contains a plurality of metal oxide particles that change a light absorption property by irradiation with an ultraviolet light. The sealing body is formed on the substrate so as to seal the light-emitting element. The sealing body has translucency to a light emitted from the light-emitting element.

A light-emitting device according to the present invention includes a substrate, a plurality of electrodes, a plurality of light-emitting elements, a variable light absorbing layer, and a sealing body. The plurality of electrodes are formed on the substrate. The plurality of light-emitting elements are placed side by side on the substrate and electrically connected to the plurality of respective electrodes. The variable light absorbing layer is formed so as to cover the plurality of electrodes on the substrate. The variable light absorbing layer contains a plurality of metal oxide particles that change a light absorption property by irradiation with an ultraviolet light. The sealing body is formed on the substrate so as to seal the plurality of light-emitting elements. The sealing body has translucency to lights emitted from the plurality of light-emitting elements.

DETAILED DESCRIPTION OF THE INVENTION

Figure 2A:
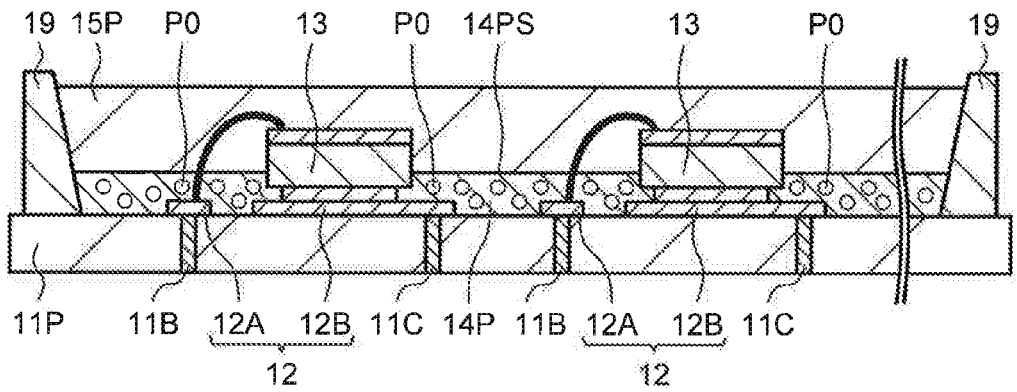
Figure 2B:
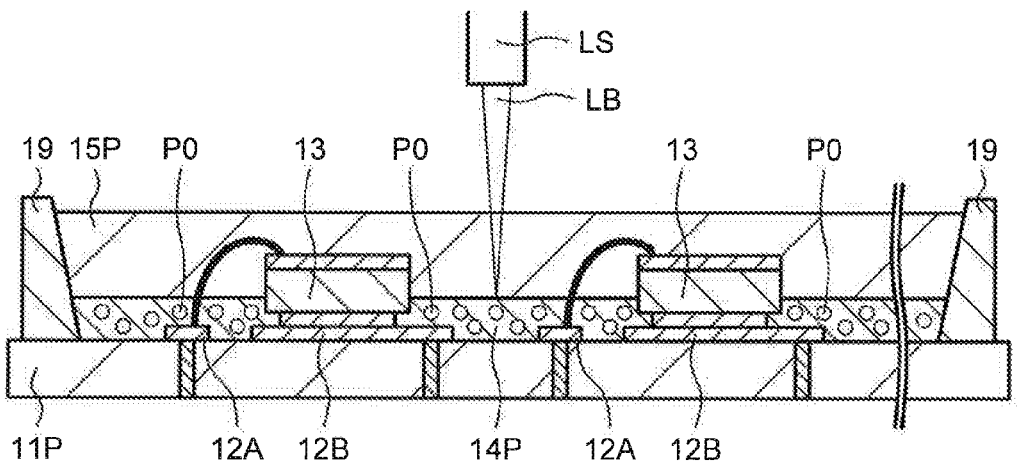
Figure 2C:
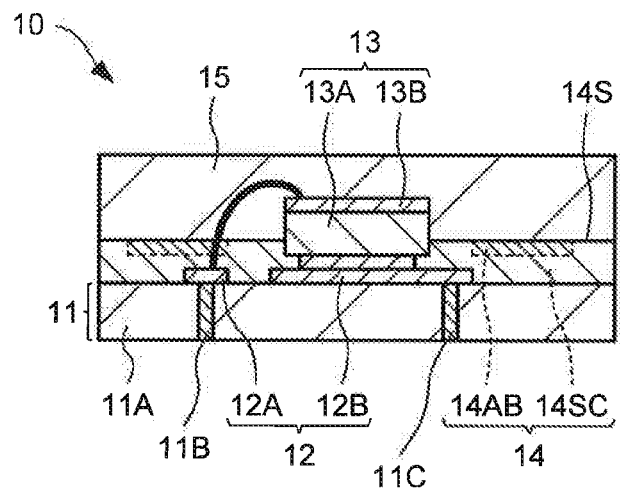
Figure 3:
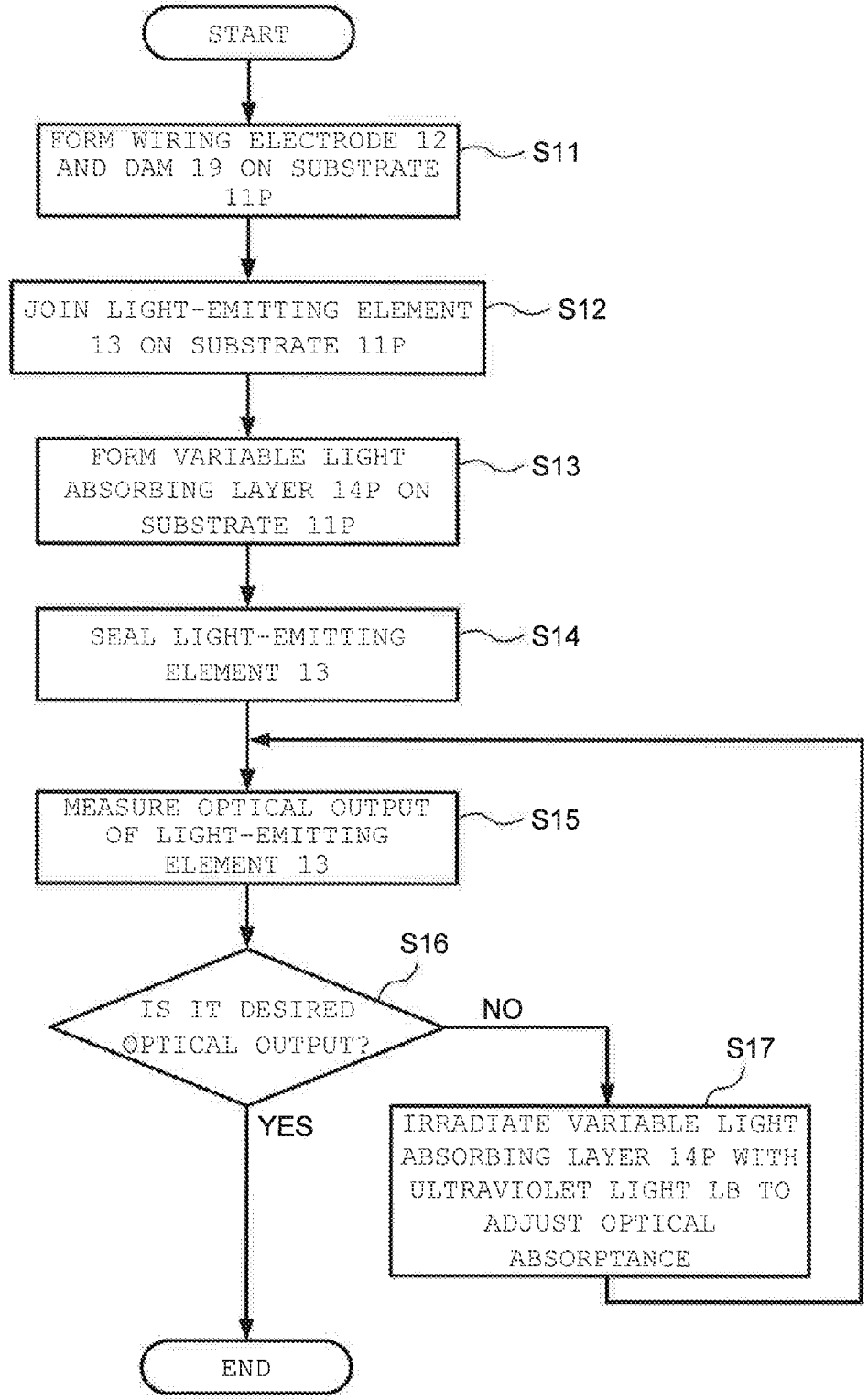
Figure 4A:
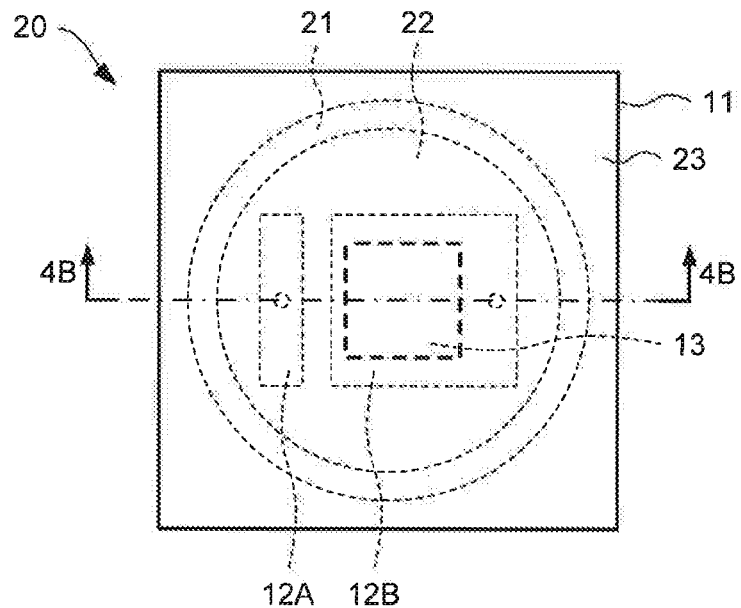
Figure 4B:
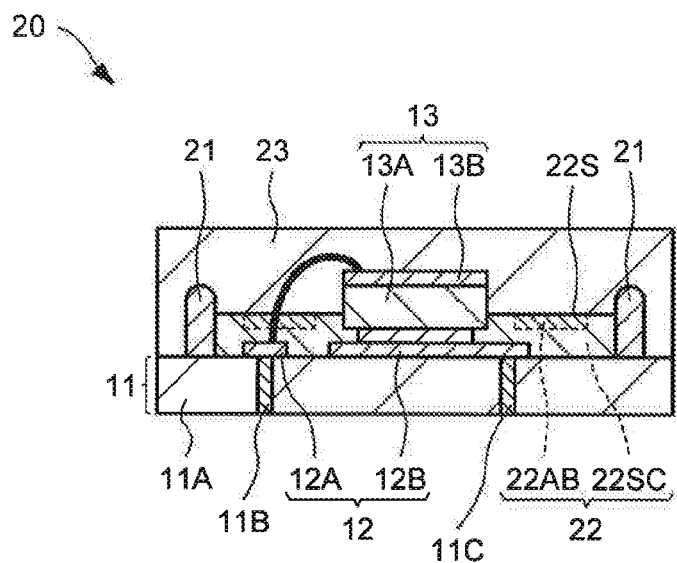
Figure 5A:
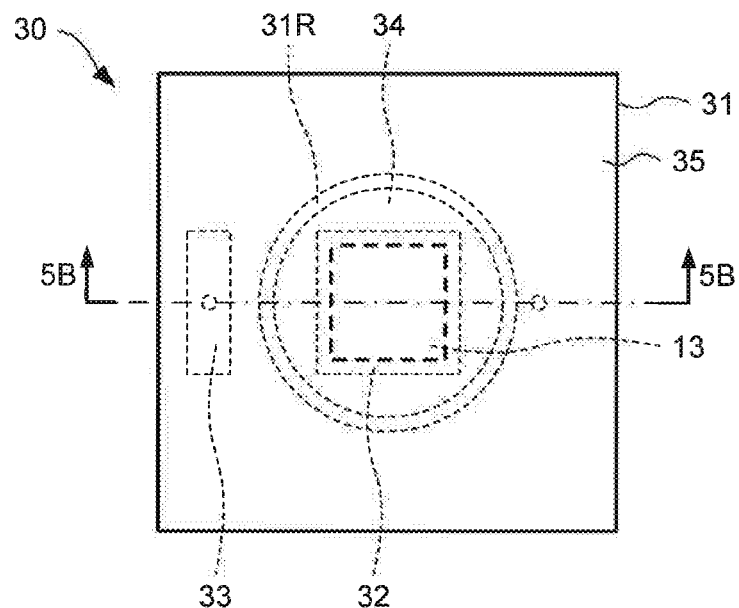
Figure 5B:
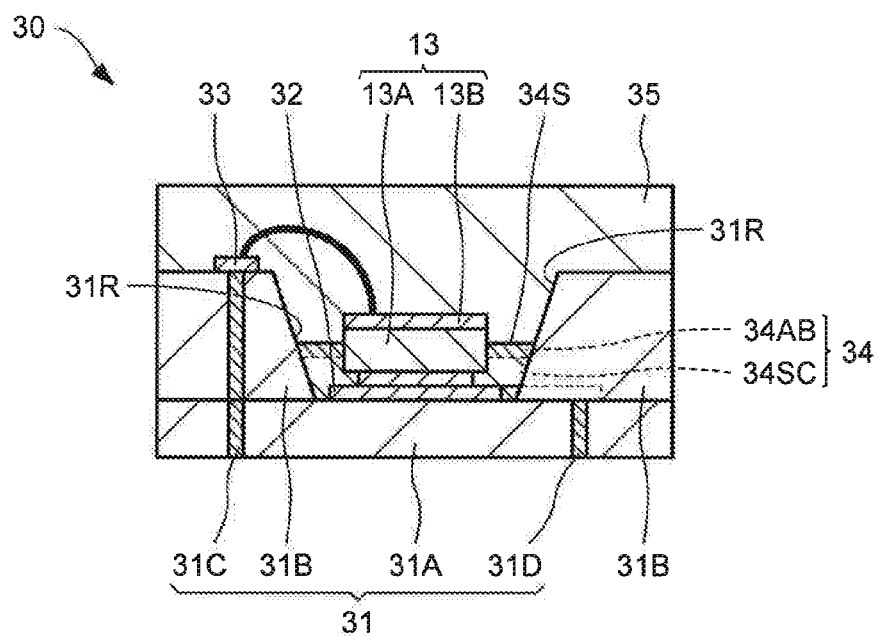
Figure 6A:
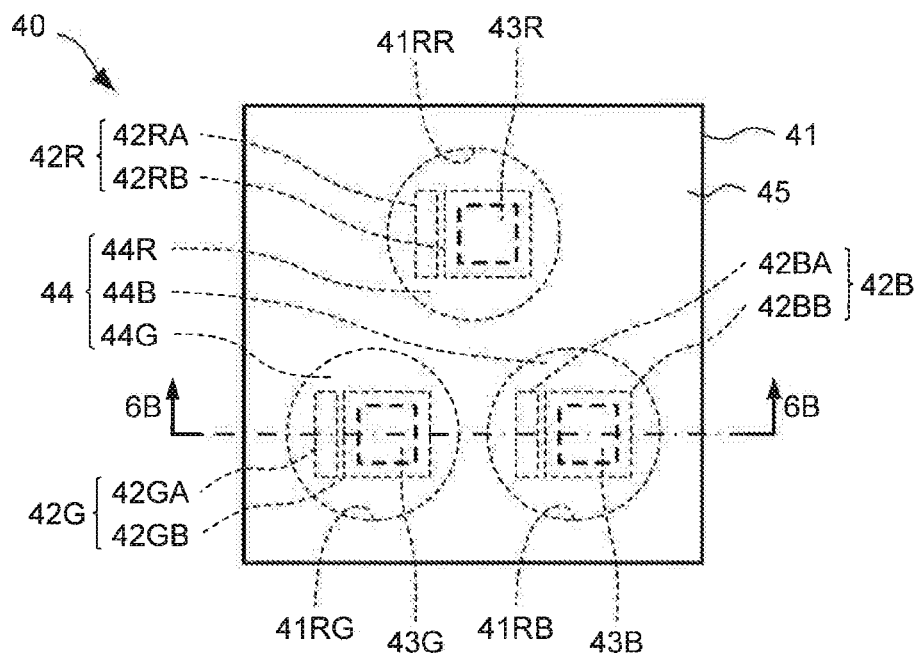
Figure 6B:
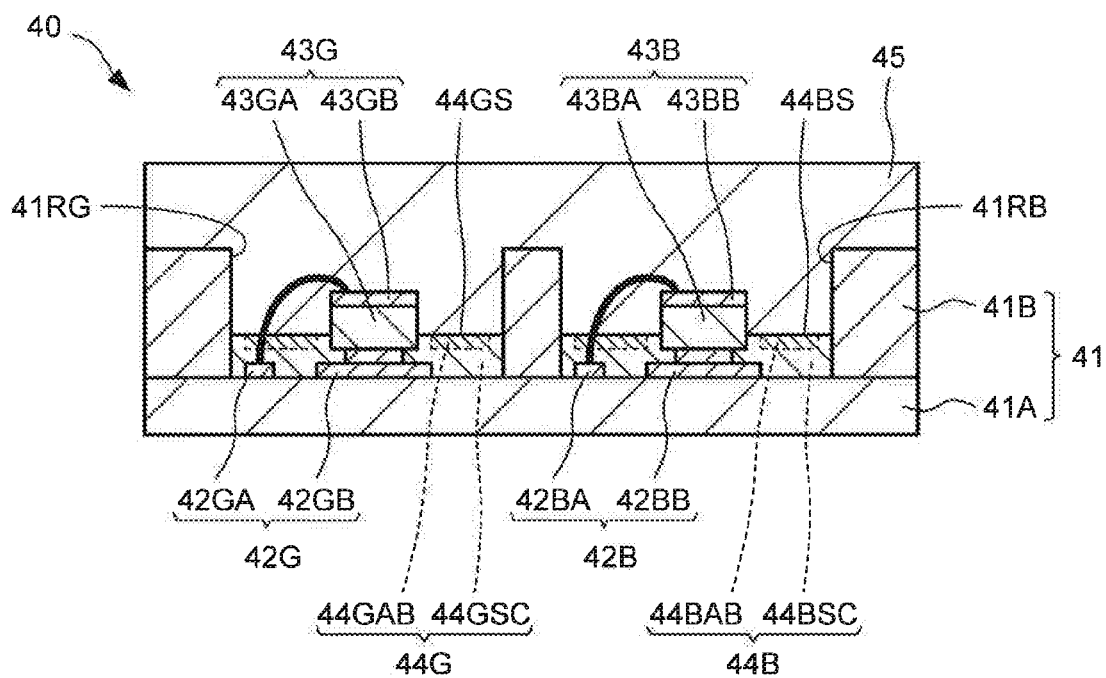

FIG. 2A, FIG. 2B, and FIG. 2C are drawings illustrating a manufacturing method of the light-emitting device according to Embodiment 1;

FIG. 3 is a drawing depicting an adjustment method of an optical output in the light-emitting device according to Embodiment 1;

FIG. 4A is a top view of a light-emitting device according to Embodiment 2;

FIG. 4B is a cross-sectional view of the light-emitting device according to Embodiment 2;

FIG. 5A is a top view of a light-emitting device according to Embodiment 3;

FIG. 5B is a cross-sectional view of the light-emitting device according to Embodiment 3;

FIG. 6A is a top view of a light-emitting device according to Embodiment 4;

FIG. 6B is a cross-sectional view of the light-emitting device according to Embodiment 4; and FIG. 7 is a cross-sectional view of a light-emitting device according to a modification of Embodiment 4.

DETAILED DESCRIPTION OF THE INVENTION

The following describes Embodiments of the present invention in detail.

Embodiment 1

Figure 1A:
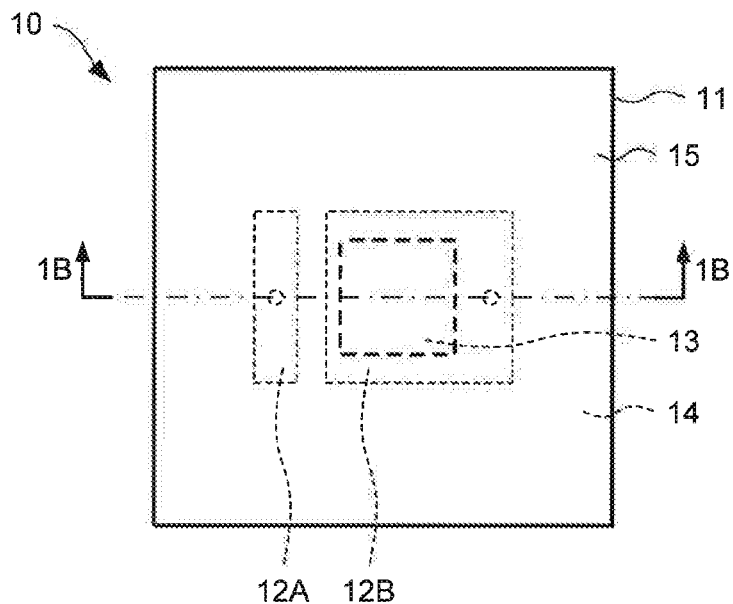
FIG. 1A is a top view of a light-emitting device according to Embodiment 1.
Figure 1B:
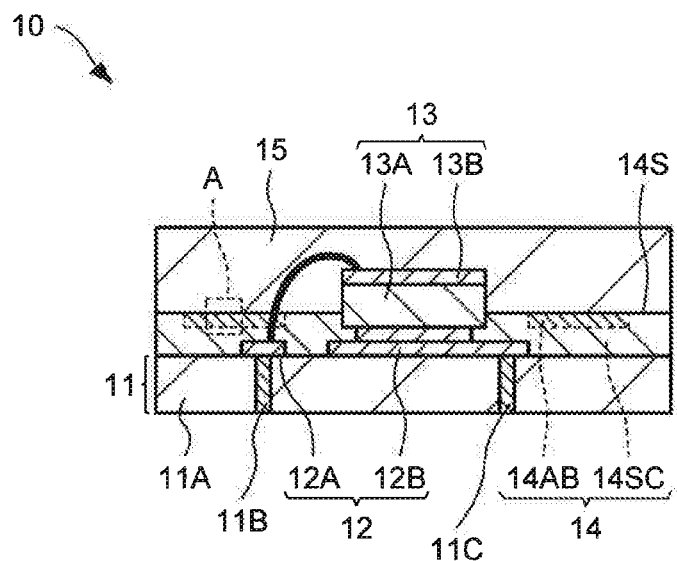
FIG. 1B is a cross-sectional view of the light-emitting device according to Embodiment 1.
Figure 1C:
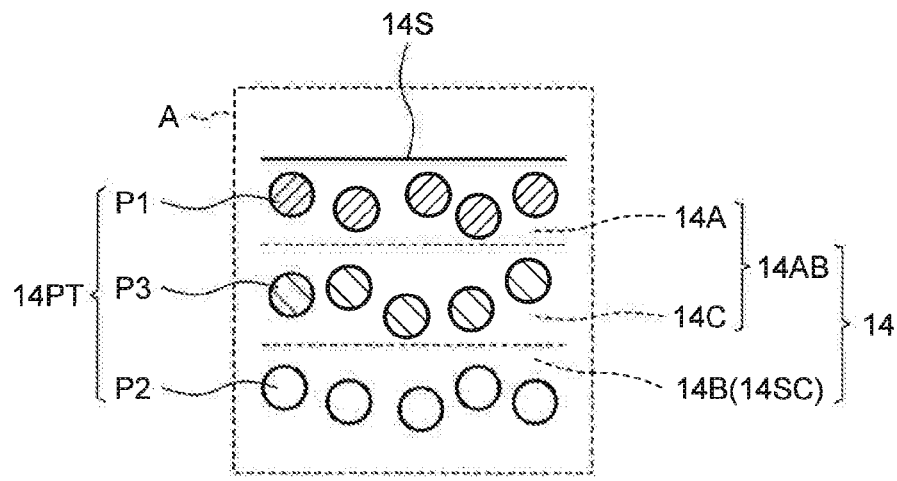
FIG. 1C is an enlarged cross-sectional view of the light-emitting device according to Embodiment 1.

FIG. 1A is a schematic top view of a light-emitting device 10 according to Embodiment 1. FIG. 1B is a cross-sectional view taken along the line 1B-1B of FIG. 1A. FIG. 1C is an enlarged cross-sectional view illustrating the enlarged part A enclosed by the dashed line in FIG. 1B. A configuration of the light-emitting device 10 will be described using FIG. 1A to FIG. 1C.

The light-emitting device 10 includes amounting substrate (hereinafter simply referred to as a substrate) 11, a wiring electrode 12 formed on the substrate 11, and a light-emitting element 13 mounted on the substrate 11. The light-emitting device 10 includes a variable light absorbing layer 14 that is formed so as to cover the wiring electrode 12 on the substrate 11 and can change absorbency to a light emitted from the light-emitting element 13. Additionally, the light-emitting device 10 includes a sealing body 15 that is disposed on the substrate 11 so as to seal the light-emitting element 13 and has translucency to the light emitted from the light-emitting element 13.

In this embodiment, the substrate 11 includes an insulating plate-shaped base material 11A and first and second through-electrodes 11B and 11C disposed inside the base material 11A so as to pass through between an upper surface and a lower surface of the base material 11A. In this embodiment, the upper surface of the base material 11A is a surface on which the wiring electrode 12 and the light-emitting element 13 are disposed in the substrate 11 and is a mounting surface of the light-emitting element 13 in the substrate 11. The lower surface of the base material 11A is a surface on a side opposite to this upper surface. Although not illustrated, the substrate 11 includes a back surface electrode that is disposed on the lower surface of the base material 11A and functions as an external terminal.

In this embodiment, the wiring electrode 12 includes a first wiring electrode 12A, which is electrically connected to the first through-electrode 11B and wired on the substrate 11. The wiring electrode 12 also includes a second wiring electrode 12B, which is electrically connected to the second through-electrode 11C, wired on the substrate 11 and insulated from the first wiring electrode 12A. The first and second wiring electrode 12A and 12B are, for example, made of a metal containing any of copper and silver patterned on the upper surface of the base material 11A in the substrate 11. In addition, for example, Ni, Ti, and Au may be formed and laminated on surfaces of the first and second wiring electrodes 12A and 12B.

The light-emitting element 13 is a semiconductor light-emitting element, such as a light-emitting diode. In this embodiment, the light-emitting element 13 includes a supporting substrate 13A and a semiconductor layer 13B, which is supported by the supporting substrate 13A and includes a light-emitting layer. For example, the supporting substrate 13A is formed of a Si substrate. For example, the semiconductor layer 13B is formed of a nitride-based semiconductor. The light-emitting element 13 emits, for example, light at a wavelength of from 420 to 470 nm (hereinafter may be referred to as blue light).

For example, the light-emitting element 13 includes the supporting substrate 13A, the semiconductor layer 13B formed on an upper surface of the supporting substrate 13A, a first element electrode (not illustrated) formed on the semiconductor layer 13B, and a second element electrode (not illustrated) formed on a bottom surface of the supporting substrate 13A.

Additionally, in this embodiment, this first element electrode of the light-emitting element 13 is connected to the first wiring electrode 12A via, for example, a bonding wire, such as a gold wire. This second element electrode of the light-emitting element 13 is bonded and connected to the second wiring electrode 12B via a conductive bonding member. For example, as this conductive bonding member, an Au bump, an Au—Sn alloy, nanoparticles of Au, Ag, or Cu, and a paste of Ag can be used.

Note that the configuration of the light-emitting element 13 is not limited to this. For example, the light-emitting element 13 may include a growth substrate used for crystal growth of the semiconductor layer 13B. In this case, for example, the light-emitting element 13 includes the growth substrate as the supporting substrate 13A, the semiconductor layer 13B grown on this growth substrate, and the first element electrode and the second element electrode formed on this semiconductor layer 13B. In this case, joining the growth substrate to the substrate 11 fixes the light-emitting element 13 to the substrate 11. The first and second element electrodes are connected to the first and second wiring electrode 12A and 12B of the substrate 11 via bonding wire.

As another configuration of the light-emitting element 13, the semiconductor layer 13B may be placed on the mounting surface of the substrate 11. In this case, the light-emitting element 13 includes the first and second element electrodes formed on the semiconductor layer 13B. Additionally, the first and second element electrodes of the light-emitting element 13 are bonded on the substrate 11 via conductive bonding members (also referred to as flip-chip bonding). In this case, the semiconductor layer 13B is disposed on the substrate 11, and the translucent supporting substrate 13A or the growth substrate used for the crystal growth of the semiconductor layer 13B is disposed on the semiconductor layer 13B.

In this embodiment, a case where the light-emitting element 13 has a rectangular (square in this embodiment) upper surface shape when viewed in a direction perpendicular to the mounting surface of the light-emitting element 13 in the substrate 11 will be described. However, the upper surface shape of the light-emitting element 13 is not limited to the rectangular shape and may be various kinds of shapes, such as a circular shape, an elliptical shape, and an elongated shape. In this embodiment, the upper surface (for example, the surface of the semiconductor layer 13B or the supporting substrate 13A on the side opposite to the substrate 11) of the light-emitting element 13 functions as a light extraction surface of the light-emitting element 13.

On the light extraction surface of the light-emitting element 13, a wavelength conversion member that absorbs the light emitted from the light-emitting element 13 and emits light at a wavelength longer than a wavelength of this absorbed light may be disposed. For example, as this wavelength conversion member, phosphor particles, a phosphor plate, and nano-sized wavelength conversion particles are usable. This allows generating, for example, light at a wavelength different from that of the blue light. For example, the use of the wavelength conversion member that generates light generating yellow light allows the light-emitting device 10 to emit light recognized as white light.

The variable light absorbing layer 14 irradiates ultraviolet light to change light absorbency. As described later, the variable light absorbing layer 14 is formed of, for example, titanium oxide particles and a medium (matrix) containing titanium oxide particles. In this embodiment, the variable light absorbing layer 14 is formed in a layer shape in a side portion of the light-emitting element 13 on the substrate 11.

The titanium oxide particles in the variable light absorbing layer 14 change the property by irradiation with the ultraviolet light and, for example, change absorbency to the light emitted from the light-emitting element 13. In this embodiment, the variable light absorbing layer 14 absorbs the light emitted from the light-emitting element 13 in a part of a region and causes another region to scatter and reflect this light.

In this embodiment, the variable light absorbing layer 14 includes a region (hereinafter referred to as a scattering reflection region) 14SC that is disposed on the substrate 11, is not irradiated with the ultraviolet light, and contains the titanium oxide particles that causes the light emitted from the light-emitting element 13 to scatter and reflect, that is, the titanium oxide particles do not have the absorbency to this light.

The variable light absorbing layer 14 includes a region (hereinafter referred to as an absorbing region) 14AB that is disposed at a position away from the substrate 11 with respect to the scattering reflection region 14SC, which is at the proximity of an upper surface 14S of the variable light absorbing layer 14 in this embodiment, and contains the titanium oxide particles having the absorbency to the light emitted from the light-emitting element 13 by the irradiation with the ultraviolet light.

The sealing body 15 is disposed on the substrate 11 so as to bury the light-emitting element 13. In this embodiment, the sealing body 15 completely covers the upper surface and the side surfaces of the light-emitting element 13, and the upper surface 14S of the variable light absorbing layer 14. The sealing body 15 has an insulating property and has translucency to the light emitted from the light-emitting element 13. For example, the sealing body 15 is made of silicone resin and epoxy resin.

The following describes the variable light absorbing layer 14 in detail. The variable light absorbing layer 14 is formed on the upper surface of the substrate 11 so as to contact a lower region of the side surface of the light-emitting element 13 and reach an end portion of the upper surface (mounting surface) of the substrate 11. In this embodiment, the side surface of the variable light absorbing layer 14 is exposed to an external atmosphere.

More specifically, in this embodiment, the variable light absorbing layer 14 contacts the sealing body 15 by the upper surface 14S and contacts the light-emitting element 13 by the inner surface. In this embodiment, the variable light absorbing layer 14 contacts the substrate 11 and the wiring electrode 12 by the bottom surface. Meanwhile, the variable light absorbing layer 14 has an outer surface exposed to the air or to the external atmosphere.

Figure 1D:
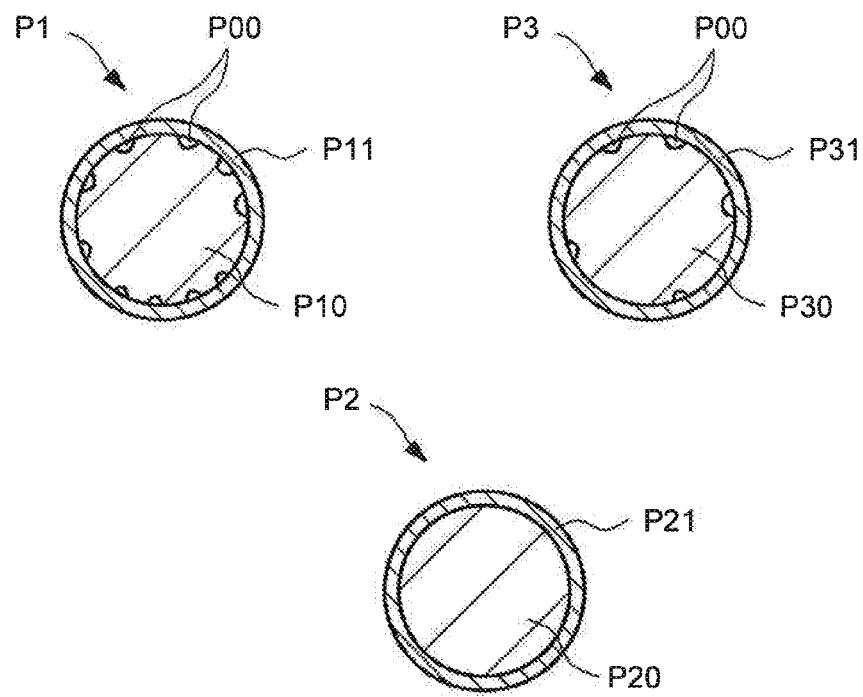
FIG. 1D is a cross-sectional view of particles in a variable light absorbing layer in the light-emitting device according to Embodiment 1.

Next, an internal structure of the variable light absorbing layer 14 will be described using FIG. 1C and FIG. 1D. FIG. 1D is a schematic cross-sectional view of the particles contained in the variable light absorbing layer 14. First, as illustrated in FIG. 1C, the variable light absorbing layer 14 contains a particle group 14PT containing a plurality of titanium oxide particles (FIG. 1C illustrates first, second, and third titanium oxide particles P1, P2, and P3) dispersed in the variable light absorbing layer 14.

In this embodiment, the variable light absorbing layer 14 contains the medium that disperses the particle group 14PT. Examples of this medium include thermosetting silicone resin and epoxy resin. That is, the variable light absorbing layer 14 is formed of a resin body containing the particles. In this embodiment, the resin body as this medium has a property that transmits visible light. Note that in this embodiment, the medium of the variable light absorbing layer 14 contacts the substrate 11, the wiring electrode 12, the light-emitting element 13, the sealing body 15, and the like.

As illustrated in FIG. 1D, the first to third titanium oxide particles P1 to P3 contain titanium oxides P10, P20, and P30 and coating films P11, P21, and P31 that coat the titanium oxides (particles bodies) P10, P20, P30, respectively.

Specifically, in this embodiment, the first titanium oxide particle P1 contains the titanium oxide P10 and the coating film P11 that coats a surface of the titanium oxide P10 to protect the titanium oxide P10. The coating film P11 is a film made of an organic matter, such as alumina, silica, and a polyol. Similarly, the second and third titanium oxide particles P2 and P3 contain the titanium oxides P20 and P30 and the coating films P21 and P31 that coat surfaces of the titanium oxides P20 and P30, respectively.

Next, as illustrated in FIG. 1D, in the particle group 14PT, the first and third titanium oxide particles P1 and P3 each include parts P00 whose band gaps are smaller than those of other parts in the respective particles (in the respective titanium oxides P10 and P30). This part P00 is a part where oxygen is lost in the titanium oxide. Hereinafter, the part P00 will be referred to as an oxygen lost portion.

As illustrated in FIG. 1C, in this embodiment, the particle group 14PT contains the first to third titanium oxide particles P1 to P3 dispersed such that average densities of the oxygen lost portions P00 in the respective particles becomes low from the upper surface 14S of the variable light absorbing layer 14 to the substrate 11. For clarification of the drawing, the first and third titanium oxide particles P1 and P3 are hatched in FIG. 1C. In this embodiment, the titanium oxide particles P1 to P3 contain titanium dioxides ($TiO_2$) P10, P20, and P30 having a rutile crystalline structure, respectively.

Note that, the density of the oxygen lost portions P00 in each of the first to third titanium oxide particles P1 to P3 is, for example, a proportion occupied by the oxygen lost portions P00 in each particle and, for example, an area occupied by the oxygen lost portions P00 in the surface of each of the titanium oxides P10 to P30.

In this embodiment, in the particle group 14PT, the first titanium oxide particles P1, which are dispersed in a region (hereinafter may be referred to as a first region) 14A on the upper surface 14S side most in the variable light absorbing layer 14 contain the oxygen lost portions P00 at the highest density (first density).

For example, the oxygen lost portions P00 in the first titanium oxide particle P1 have band gap energy smaller than energy of the visible light (in detail, energy of a wavelength of the visible light). For example, in this embodiment, the oxygen lost portions P00 in the first titanium oxide particle P1 have the band gap energy (for example, about 1.5 eV) smaller than the energy of the emitted light from the light-emitting element 13 (the blue light in this embodiment).

Additionally, in the particle group 14PT, the second titanium oxide particles P2 dispersed in a region (hereinafter may be referred to as a second region) 14B on the substrate 11 side most in the variable light absorbing layer 14 contain the oxygen lost portions P00 at the lowest density (second density).

For example, as illustrated in FIG. 1D, the second titanium oxide particle P2 hardly contains the oxygen lost portions P00. Accordingly, for example, the second titanium oxide particle P2 has the band gap energy larger than the energy of the emitted light from the light-emitting element 13 at any part (almost entirely).

For example, in the case where the second titanium oxide particle P2 (titanium oxide P20) has the rutile crystalline structure, the second titanium oxide particle P2 has the band gap energy of 3.0 eV. Note that in a case where the second titanium oxide particle P2 has an anatase crystalline structure, the second titanium oxide particle P2 has the band gap energy of 3.2 eV.

Additionally, in the particle group 14PT, the third titanium oxide particles P3 dispersed in a region (hereinafter may be referred to as a third region) 14C between the first and second regions 14A and 14B contain the oxygen lost portions P00 at the density smaller than that of the first titanium oxide particles P1 and larger than that of the second titanium oxide particles P2 (third density (the density between the first density and the second density).

It is understood that the band gap of the crystals of the titanium oxide becomes small due to oxygen loss. More specifically, the oxygen loss forms an intermediate level between a valence band and a conductive band of the titanium oxide. The band gap here means an energy gap between this intermediate level and the valence band or the conductive band.

Here, the following describes the band gap (a local band gap in each particle) in the first to third titanium oxide particles P1 to P3. The crystal having the band gap has an optical property that absorbs the light at the wavelength of energy larger than the band gap energy and transmits the light at the wavelength of the energy smaller than this.

In this embodiment, the oxygen lost portion P00 in each of the first and third titanium oxide particles P1 and P3 has the band gap energy smaller than the band gap energy equivalent to the wavelength of the visible light.

For example, the optical energy of the light at the wavelength of 450 nm (blue light in the atmosphere) is about 2.76 eV and the optical energy of the light at the wavelength of 630 nm (red light in the atmosphere) is about 1.67 eV. As described above, the first and third titanium oxide particles P1 and P3 contain the oxygen lost portions P00 having the band gap energy of 1.5 eV. Therefore, the respective first and third titanium oxide particles P1 and P3 absorb the visible light by the oxygen lost portions P00.

Meanwhile, the second titanium oxide particles each P2 does not contain (hardly contains) the oxygen lost portions P00. That is, the almost whole second titanium oxide particles P2 have the band gap energy of 3.0 eV (for example, in the case of rutile). Accordingly, the second titanium oxide particles P2 function as scattering reflection particles that do not absorb the visible light but transmit and scatter the visible light.

Note in this embodiment, since the first and third titanium oxide particles P1 and P3 (the first and third regions 14A and 14C) absorb the visible light under observation using white visible light, the first and third titanium oxide particles P1 and P3 take on black or gray. In this embodiment, the second titanium oxide particles P2 (second region 14B) take on white under observation using the white visible light.

In other words, in this embodiment, the first and third regions 14A and 14C function as the visible light absorbing region (hereinafter simply referred to as the absorbing region) 14AB that absorbs the visible light. Meanwhile, the second region 14B functions as the visible light scattering reflection region (hereinafter simply referred to as the scattering reflection region) 14SC that scatters and reflects the visible light.

In this embodiment, the first and third titanium oxide particles P1 and P3 are dispersed only in the regions at a predetermined depth at the proximity of the upper surface 14S of the variable light absorbing layer 14. For example, the first and third titanium oxide particles P1 and P3 are dispersed only in the regions within a range of a thickness (depth) of 20 μm or less from the upper surface 14S.

Therefore, the variable light absorbing layer 14 functions as the absorbing region 14AB at the proximity of the upper surface 14S and functions as the scattering reflection region 14SC inside.

Note that in this embodiment, the absorbing region 14AB is disposed on a part of the upper surface 14S of the variable light absorbing layer 14. In other words, in this embodiment, the variable light absorbing layer 14 includes the absorbing region 14AB on a part at the proximity of the upper surface 14S.

In this embodiment, the first to third titanium oxide particles P1 to P3 are dispersed at a uniform dispersion density as a whole inside the variable light absorbing layer 14 (inside the medium). However, the first to third titanium oxide particles P1 to P3 may be dispersed such that the dispersion density (content) gradually increases from the upper surface 14S of the variable light absorbing layer 14 to the substrate 11. For example, the particle group 14PT may be dispersed in the region close to the substrate 11 in the variable light absorbing layer 14 (lower region) at the density higher than that in the region close to the upper surface 14S (upper region).

Note that the first, second, and third titanium oxide particles P1, P2, and P3 contain the coating films P11, P21, and P31, respectively. This allows the first to third titanium oxide particles P1 to P3 to have a resistance against yellowing (yellowing resistance) and a weather resistance due to low-intensity ultraviolet rays present under usage environment of the light-emitting device 10. However, in a case where the resistance against yellowing and the weather resistance due to the ultraviolet rays are unnecessary, the first to third titanium oxide particles P1 to P3 need not to contain the coating films P11 to P31.

FIG. 2A, FIG. 2B, and FIG. 2C are drawings illustrating each step of a manufacturing method of the light-emitting device 10. FIG. 2A to FIG. 2C are cross-sectional views each similar to FIG. 1A during each step. FIG. 3 is a flowchart depicting the manufacturing method of the light-emitting device 10. The manufacturing method of the light-emitting device 10 will be described using FIG. 2A to FIG. 2C and FIG. 3.

First, FIG. 2A is a drawing illustrating a substrate 11P on which a plurality of the light-emitting elements 13, a variable light absorbing layer 14P that does not include the absorbing region 14AB (hereinafter similarly referred to as a variable light absorbing layer) and a sealing layer 15P, and a dam 19 to form the variable light absorbing layer 14P and the sealing layer 15P are formed. In this embodiment, first, the substrate 11P (a base material on which the plurality of first and second through-electrodes 11B and 11C are formed) is prepared, and the wiring electrode 12 and the dam 19 are formed on the substrate 11P (Step S11 in FIG. 3).

Next, the light-emitting element 13 is joined on the substrate 11P (Step S12 in FIG. 3). Subsequently, the variable light absorbing layer 14P is formed inside the dam 19 on the substrate 11P (Step S13 in FIG. 3). In this embodiment, silicone resin containing the titanium oxide particles P0 similar to that of the second titanium oxide particles P2 was filled and heated for a short period for temporary curing (a state in which cross-linking between molecules in the silicone resin is insufficient is set) to form the variable light absorbing layer 14P.

Note that in this embodiment, as the titanium oxide particles P0, a rutile titanium dioxide with an average grain diameter of 250 nm and the band gap energy of 3.0 eV was used. A concentration of the titanium oxide particles P0 in the variable light absorbing layer 14P was set to 16 wt %.

Next, the light-emitting element 13 is sealed (Step S14 in FIG. 3). In this embodiment, a region inside the dam 19 on the substrate 11P was filled with the translucent silicone resin so as to bury the light-emitting element 13. Then, this silicone resin was heated for complete curing to form the sealing body 15.

Note that in this embodiment, ultraviolet light is used to adjust optical absorptance in the variable light absorbing layer 14. Therefore, in this embodiment, as the sealing body 15, a resin material having translucency to both of the ultraviolet light and the visible light was used.

FIG. 2B is a drawing illustrating the substrate 11P in which an upper surface 14PS of the variable light absorbing layer 14P is irradiated with an ultraviolet light LB. In this embodiment, after the sealing step S14, an output of the light taken out from the sealing body 15 is measured (Step S15 in FIG. 3). Then, based on the measurement result of the optical output, the variable light absorbing layer 14P is irradiated with the ultraviolet light LB and the optical absorptance by the variable light absorbing layer 14P is adjusted.

Specifically, whether the result of the measuring step S15 is a desired result, which is whether the desired optical output is obtained in this embodiment, is determined (Step S16 in FIG. 3). Note that when the desired optical output is obtained, the optical output needs not to be adjusted.

Meanwhile, in the case where the desired optical output is not obtained, the variable light absorbing layer 14P is irradiated with the ultraviolet light LB to adjust the optical absorptance by the variable light absorbing layer 14P (Step S17 in FIG. 3). In this embodiment, an ultraviolet region was irradiated with laser light as the ultraviolet light LB having a peak wavelength in the variable light absorbing layer 14P from outside the sealing body 15. In this embodiment, a laser light source LS that emits the laser light at a wavelength of 355 nm was prepared. While this laser light is scanned, the laser light is emitted to the variable light absorbing layer 14P from the surface of the sealing body 15. Thus, the ultraviolet light LB transmits the sealing body 15, and the variable light absorbing layer 14P is irradiated with the ultraviolet light LB.

In this embodiment, while the laser light at a beam diameter of $\varphi 45$ μm and an output of 50 kW/cm² was moved at a speed of 1000 mm/sec, the variable light absorbing layer 14P was irradiated with the laser light. Note that energy of the light at the wavelength of 355 nm is about 3.5 eV, and the band gap energy of the rutile titanium dioxide is 3.0 eV. Therefore, the energy of the ultraviolet light LB is greater than the band gap energy of the titanium oxide particle P0. Therefore, the ultraviolet light LB is absorbed into the titanium oxide particle P0.

Accordingly, the property of the titanium oxide particles P0 irradiated with the ultraviolet light LB is changed and oxygen atoms in the particles are desorbed. The titanium oxide particles P0 at the proximity of the upper surface 14PS of the variable light absorbing layer 14P are concentratedly irradiated with the ultraviolet light LB. Therefore, the titanium oxide particles where the oxygen loss is the largest are generated at the proximity of the upper surface 14PS of the variable light absorbing layer 14P, and the titanium oxide particles where the degree of the oxygen loss is small are generated as away from the upper surface 14PS.

Thus, the titanium oxide particles P0 at the proximity of the upper surface 14PS of the variable light absorbing layer 14P strongly irradiated with the ultraviolet light LB comparatively become the titanium oxide particles containing the oxygen lost portions P00 at high density, namely, the first titanium oxide particles P1. The titanium oxide particles P0 slightly away from the upper surface 14PS of the variable light absorbing layer 14P become the third titanium oxide particles P3 containing the comparatively reduced oxygen lost portions P00.

When being separated from the upper surface 14PS at a predetermined distance (a distance with which the ultraviolet light LB is blocked by the titanium oxide particles P0) or more, the ultraviolet light LB is no longer irradiated and does not change the property of the titanium oxide particles P0. Therefore, for example, the titanium oxide particles P0 present at the proximity of the substrate 11P become the titanium oxide particles that hardly contain the oxygen lost portions P00, namely, the second titanium oxide particles P2.

Thus, by the irradiation with the ultraviolet light LB, the variable light absorbing layer 14P containing the plurality of titanium oxide particles (particle group 14PT) dispersed such that the density of the oxygen lost portions P00 gradually decreases is formed.

Then, regardless of whether the optical output is adjusted, the substrate 11P is individualized with respect to each light-emitting element 13 to generate the light-emitting device 10 (FIG. 2C). When the optical output is adjusted, the variable light absorbing layer 14 irradiated with the ultraviolet light LB includes the absorbing region 14AB at the proximity of the upper surface 14S and includes the scattering reflection region 14SC in the region other than the absorbing region 14AB, for example, the region on the substrate 11 side with respect to the absorbing region 14AB.

The variable light absorbing layer 14 has the optical absorptance higher than that of the variable light absorbing layer 14P before being irradiated with the ultraviolet light LB. Therefore, in this embodiment, the irradiation with the ultraviolet light LB lowers the output of the light taken out from the sealing body 15. That is, in this embodiment, irradiating the variable light absorbing layer 14P with the ultraviolet light LB allows adjusting the output to lower the optical output. Further, after the irradiating step with the ultraviolet light LB (Step S17), for example, after individualizing the substrate 11P, the optical output is measured (step S15) again, and thus the output can be repeatedly adjusted until the desired output is obtained.

Therefore, the light-emitting device 10 includes the variable light absorbing layer 14, which is irradiated with this ultraviolet light LB and includes the absorbing region 14AB, or includes the variable light absorbing layer 14, which is not irradiated with the ultraviolet light LB and includes only the titanium oxide particles P0 (only the scattering reflection region 14SC). The light-emitting device 10 thus manufactured provides the stable optical output.

Note that in the irradiating step with the ultraviolet light LB (Step S17), the output of the light source unit LS is preferably adjusted so as not to cause another material to change its property, for example, the substrate 11, the wiring electrode 12, the medium of the variable light absorbing layer 14 (for example, the silicone resin), and the sealing body 15. The irradiation with the ultraviolet light (laser light) LB under, for example, the above-described conditions allows changing the property of the titanium oxide particles P0 alone while reducing the change in the property of the other materials.

The inventors of this application have confirmed that the laser light under these conditions (and the output within the range of 25 to 75 kW/cm²) does not change the property of the medium of the variable light absorbing layer 14 or the silicone resin as the sealing body 15. For example, as the medium of the variable light absorbing layer 14, the use of the silicone resin having transmittance of 60% or more to the light at the wavelength of 355 nm is preferred.

Additionally, taking the stable adjustment of the density of the oxygen lost portions P00 by the irradiation with the ultraviolet light LB into consideration, the concentration of the particle group 14PT (for example, the titanium oxide particles P0) is preferably 30 wt % or less and further preferably 20 wt % or less.

This is because, for example, when the titanium oxide particles P0 are contained at the concentration higher than 30 wt %, for example, even the ultraviolet light LB is irradiated under the above-described conditions, the formation of the oxygen lost portions P00 in the titanium oxide particles P0 is often difficult. It is considered that in the medium in which the titanium oxide particles P0 are dispersed at the concentration higher than 30 wt %, the ultraviolet light LB scatters across the wide range before the titanium oxide particles P0 cause the oxygen loss, and this causes the above-described situation. Therefore, the titanium oxide particles P0 having the concentration higher than 30 wt % fails to stably adjust the optical absorptance in some cases.

Note that the titanium oxide particles P0 only need to have the above-described concentration at the proximity of the upper surface 14S, and the concentration of the inside is not limited to 30 wt % or less. For example, the variable light absorbing layer 14 may contain the titanium oxide particles P0 at the concentration of 30 wt % or less at the proximity of the upper surface 14S and may contain the titanium oxide particles P0 at the concentration higher than 30 wt % at the proximity of the substrate 11. For example, the titanium oxide particles P0 only need to be dispersed at the concentration of 30 wt % or less in the region at the predetermined depth from the upper surface 14S of the variable light absorbing layer 14.

Taking the satisfactory adjustment of the light absorbency with the ultraviolet light LB into consideration, a grain diameter (average grain diameter) of the titanium oxide particles P0 is preferably in a range, for example, from 150 to 350 nm.

Specifically, when the average grain diameter of the particle group 14PT (titanium oxide particles P0) is set in the range around from one to a quarter relative to the wavelength of the light (visible light) in the variable light absorbing layer 14 (for example, the wavelength in the silicone resin), the scattering in which a backscatter proportion is high is generated, thereby ensuring obtaining the satisfactory scattering reflection. Further, by adjusting the average grain diameter of the particles in the particle group 14PT, the light is scattered, taken in, and absorbed into the particles at a high probability, and thus the optical absorptance can be properly adjusted.

In addition to ease of the adjustment of the light absorbency, considering that the titanium oxide particles P0 function as satisfactory scattering particles of the visible light in the state without the irradiation with the ultraviolet light LB, that is, the satisfactory scattering reflectivity of the visible light is provided to the scattering reflection region 14SC, the titanium oxide particles P0 preferably have the average grain diameter within a range of from 200 to 300 nm.

For example, as described above, the variable light absorbing layer 14 has the particles structure appropriate for changing the optical absorptance by the irradiation with the ultraviolet light LB. Thus, the variable light absorbing layer 14 becomes a member that ensures easily adjusting the optical output after sealing.

The manufacturing method of the light-emitting device 10 is not limited to this. For example, particle-containing resin serving as the variable light absorbing layer 14P is applied and heated after being left for a predetermined period to precipitate the titanium oxide particles P0. This allows forming the variable light absorbing layer 14 with the dispersion density of the titanium oxide particles P0 on the upper surface 14PS side lowered.

Thus, in this embodiment, the variable light absorbing layer 14 containing the particle group 14PT containing the titanium oxide particles P0 that change their light absorption property by the irradiation with the ultraviolet light LB is provided. Therefore, after the light-emitting element is sealed, for example, even after completion or after shipment, or for example, by a customer, the optical output can be easily adjusted. This allows providing the light-emitting device 10 that can easily adjust the optical property after mounting.

In this embodiment, the resin body as the dispersion medium of the particle group 14PT in the variable light absorbing layer 14 is integrally formed. That is, for example, the variable light absorbing layer 14 contains one resin matrix that supports the respective first to third titanium oxide particles P1 to P3. A boundary of the media is absent between the respective first to third regions 14A to 14C. Therefore, mechanical strength of the variable light absorbing layer 14 is maintained in the case of disposing the absorbing region 14AB as well. Accordingly, the variable light absorbing layer 14 and the light-emitting device 10 with high quality and long life are produced.

Additionally, the particle group 14PT has the uniform dispersion density as a whole in the variable light absorbing layer 14. Therefore, the first to third titanium oxide particles P1 to P3 are each dispersed in the variable light absorbing layer 14 at the densities in the ranges similar to one another. Therefore, a coefficient of thermal expansion of the variable light absorbing layer 14 as a whole is uniformized also in the case where the absorbing region 14AB is disposed, and this maintains the mechanical strength of the variable light absorbing layer 14. Accordingly, the variable light absorbing layer 14 and the light-emitting device 10 with high quality and long life are produced.

Note that as described above, the particle group 14PT in the variable light absorbing layer 14 may gradually increase in dispersion density toward the substrate 11. For example, in a case where the dispersion density of the first to third titanium oxide particles P1 to P3 on the substrate 11 side is increased and the dispersion density of the first to third titanium oxide particles P1 to P3 on the upper surface 14S side is decreased, adhesiveness of interfaces of the upper surface 14S of the variable light absorbing layer 14 and the sealing body 15 is improved. Therefore, for example, even when the high-output laser light as the ultraviolet light LB is irradiated multiple times, peeling of the variable light absorbing layer 14 from the sealing body 15 can be reduced.

For example, to perform the above-described Step S13, using the particle-containing resin with the content of the titanium oxide particles P0 of 32 wt %, the titanium oxide particles P0 are left to be precipitated and then are cured to form the variable light absorbing layer 14P. In this case, the concentration of the titanium oxide particles (first titanium oxide particles P1) at the proximity of the upper surface 14S in the variable light absorbing layer 14 can be adjusted to be a concentration appropriate for adjustment of the optical absorptance, for example, around 16 wt %. In this case, the light absorption property in the absorbing region 14AB at the proximity of the upper surface 14S and a light scattering property in the light scattering reflection region 14SC can be maintained, and further the adhesiveness of the variable light absorbing layer 14 with the sealing body 15 can be improved.

Additionally, in this embodiment, the variable light absorbing layer 14 contains thermosetting silicone resin having a refractive index within a range of from 1.4 to 1.55 as a resin medium. Additionally, the particle group 14PT contains, for example, anatase titanium oxide particles having a refractive index of about 2.5 or rutile titanium oxide particles having a refractive index of about 2.7. Considering obtaining the high scattering reflectivity in the scattering reflection region 14SC, the particle group 14PT (titanium oxide particles P0 or P2) preferably has the refractive index thus higher than that of the resin medium.

Additionally, as illustrated in FIG. 1D, the first to third titanium oxide particles P1 to P3 contain the coating films P11 to P31, respectively (that is, the titanium oxide particles P0 used for formation of the respective particles contain the coating films). As a result, the oxygen lost portions P00 can be effectively and stably generated on the surfaces of the respective titanium oxides P10 to P30 using the ultraviolet light LB, for example, the high output laser at the wavelength of 355 nm. This allows stably forming the absorbing region 14AB in the desired region.

In this embodiment, the wiring electrode 12 formed on the substrate 11 is covered with the variable light absorbing layer 14. The variable light absorbing layer 14 provides a protection function for the wiring electrode 12. For example, the wiring electrode 12 is less likely to be deteriorated compared with a case covered with the sealing body 15 (translucent member).

More specifically, the light-emitting device 10 can be mounted in a system installed in the atmosphere, such as a vehicle lamp. In this case, a reaction between sulfide present in the atmosphere and the metal sulfurates the metal, possibly resulting in corrosion of the metal. The material of the wiring electrode 12, for example, copper and silver, deteriorates its electrical characteristic through sulfuration.

In contrast to this, covering the wiring electrode 12 with the variable light absorbing layer 14 allows the wiring electrode 12 to be protected from corrosion, such as sulfuration. This is because, compared with the case of protection with the member not containing particles, such as the sealing body 15, the protection with the member containing the particles like the variable light absorbing layer 14 provides a function as an absorbing material against entrance of various kinds of corrosion sources (for example, sulfide and water vapor).

Accordingly, not only the function to adjust the optical property after mounting, the variable light absorbing layer 14 has the high protection function of the wiring electrode 12 (metallic material) on the substrate 11. This allows easily adjusting the optical property after mounting and allows providing the light-emitting device 10 with high quality and long life.

Note that the element electrode of the light-emitting element 13 is made of a metal having a high corrosion resistance on its outermost surface, for example, gold. Additionally, a part other than the element electrode of the light-emitting element 13 is covered with the protective film having a corrosion resistance. The bonding wire is made of a metal having a corrosion resistance, such as gold. Accordingly, even not covered with the variable light absorbing layer 14, these members hardly corrode.

Note that the above-described configurations of the variable light absorbing layer 14 are merely one example. For example, in this embodiment, the case where the absorbing region 14AB is disposed on a part of the upper surface 14S of the variable light absorbing layer 14 has been described. However, depending on the required optical property and result of the adjustment step of the optical output, the variable light absorbing layer 14 may include the absorbing region 14AB on the whole upper surface 14S.

For example, when the formation region of the absorbing region 14AB appropriate for the adjustment of the optical output is known or when local output adjustment, such as reduction of unevenness in strength, is performed, only apart of the variable light absorbing layer 14P only needs to be irradiated with the ultraviolet light LB to form the absorbing region 14AB only on the part. Meanwhile, to form a high contrast of light between the region of the light-emitting element 13 and the peripheral region, the absorbing region 14AB only needs to be formed on the whole upper surface 14PS.

In this embodiment, when the ultraviolet light LB is not irradiated, the variable light absorbing layer 14 hardly has the absorbency entirely and functions as a light reflector. Thus, the light-emitting device 10 having high output and configured to adjust the optical output is produced.

For example, in this embodiment, the case where the variable light absorbing layer 14 has the side surface exposed to the external atmosphere has been described. However, the variable light absorbing layer 14 may be completely covered with the sealing body 15.

Note that, like the variable light absorbing layer 14, forming up to the end portion of the upper surface of the substrate 11 and exposing the side surface to the external atmosphere can reliably reduce entrance and accumulation of the corrosion source to the upper surface of the substrate 11. Therefore, considering obtaining the high protection function for the wiring electrode 12, the variable light absorbing layer 14 preferably is formed up to the end portion of the upper surface of the substrate 11 and has the side surface appear (or exposed) in the external atmosphere.

The variable light absorbing layer 14 is preferably formed within a range not covering the side surface of the light-emitting layer in the semiconductor layer 13B of the light-emitting element 13. For example, the variable light absorbing layer 14 is preferably formed at a height not exceeding the light-emitting layer of the light-emitting element 13 on the substrate 11. This is because, for example, covering the side surface of the light-emitting layer with the absorbing region 14AB significantly reduces the optical output.

However, to adjust the optical output large, the variable light absorbing layer 14 only needs to be purposely formed so as to cover the side surface of the light-emitting layer of the light-emitting element 13. In other words, for example, adjusting the formation region of the variable light absorbing layer 14 as a whole allows coarse adjustment of the optical output, and adjusting the region on which the absorbing region 14AB is to be formed allows finely adjusting the optical output.

Note that in this embodiment, the case where the variable light absorbing layer 14 includes the absorbing region 14AB having the absorbency to the visible light and the scattering reflection region 14SC having the reflectivity to the visible light has been described. However, the configuration of the variable light absorbing layer 14 is not limited to this. For example, the light-emitting element 13 may have a configuration that emits light at a bandwidth other than the visible light. In this case, it is only necessary that the absorbing region 14AB and the scattering reflection region 14SC of the variable light absorbing layer 14 have the absorbency and reflectivity, respectively, to this light at another wavelength band.

In other words, for example, it is only necessary that the particles and their band gap structures in the variable light absorbing layer 14 and the media are adjusted such that the light absorption property to the light emitted from the light-emitting element 13 changes.

In this case, considering effectively disposing the absorbing region 14AB in the variable light absorbing layer 14, for example, the titanium oxide particles in the particle group 14PT preferably have the average grain diameter corresponding to the wavelength in the variable light absorbing layer 14 of the emitted light from the light-emitting element 13 (the wavelength in the medium to disperse the particle group 14PT).

In this embodiment, while the case where the absorbing region 14AB contains the first and third titanium oxide particles P1 and P3 has been described, the configuration of the particle group 14PT is not limited to this. For example, the particle group 14PT may contain, for example, only the two kinds of the titanium oxide particles P1 and P2.

In this case, for example, the average density of the oxygen lost portions P00 in the first titanium oxide particles P1 dispersed in the first region 14A at the proximity of the upper surface 14S of the variable light absorbing layer 14 in the variable light absorbing layer 14 only needs to be larger than the average density of the oxygen lost portions P00 in the second titanium oxide particles P2 dispersed in the second region 14B on the substrate 11 side with respect to the first region 14A.

For example, as described above, there may be a case where the adjustment of the optical output itself is not performed. In this case, for example, the particle group 14PT only needs to contain the second titanium oxide particles P2, that is, the titanium oxide particles P0 in the state not irradiated with the ultraviolet light LB. In other words, the variable light absorbing layer 14 only needs to contain a plurality of titanium oxide particles that change the light absorption property by the irradiation with the ultraviolet light LB.

The particles constituting the particle group 14PT are not limited to the titanium oxide particles. For example, zinc oxide (ZnO) has a property similar to that of titanium oxide. For example, the zinc oxide has band gap energy of 3.37 eV and transmits visible light. The zinc oxide has a property that absorbs the ultraviolet light LB at the wavelength of 355 nm. Furthermore, the zinc oxide has a refractive index of 2.0, which is larger than a refractive index of the silicone resin (1.4 to 1.55). The zinc oxide has a property that forms a deep donor level by oxygen loss and decreases the band gap and absorbs the visible light.

Therefore, the particle group 14PT may employ a metal oxide crystal having a property for scattering or reflecting light at a predetermined wavelength, such as visible light, in a crystalline state free from oxygen loss and absorbs this light at the wavelength by oxygen loss, such as the titanium oxide particles and zinc oxide particles. For example, the particles of the metal oxide having the property may be substituted by the titanium oxide particles P0 or P1 to P3 or may be added to the particle group 14PT. That is, the variable light absorbing layer 14 only needs to contain, for example, a plurality of metal oxide particles that change the band gap by the irradiation with the ultraviolet light LB.

To the particle group 14PT, other particles that scatter the emitted light from the light-emitting element 13 may be added, in addition to the particles that change the band gap by the irradiation with the ultraviolet light LB, such as the titanium oxide particles or the zinc oxide particles. The other particles include particles, such as metal carbide, metal nitride, and metal oxide, such as silicon carbide (SiC), silicon nitride ($Si_2N_3$), gallium nitride (GaN), aluminum nitride (AlN), and aluminum oxide ($Al_2O_3$).

In other words, for example, the variable light absorbing layer 14 only needs to contain at least a plurality of metal oxide particles that change the light absorption property by the irradiation with the ultraviolet light LB as the particle group 14PT. For example, in a case where the particle group 14PT contains a plurality of particles containing particles other than the titanium oxide particles or the zinc oxide particles, it is only necessary that the plurality of particles are dispersed at a uniform density in the variable light absorbing layer 14 or are dispersed so as to gradually increase the density from the upper surface 14S to the substrate 11. Moreover, for example, the whole particles contained in the particle group 14PT only need to be dispersed at the concentration described above.

Additionally, the particle group 14PT may contain particles having a property other than the light scattering property. For example, the particle group 14PT may contain particles appropriate for protection of the wiring electrode 12. For example, nanoparticles of silicon oxide have a property appropriate for reduction of sulfuration of the wiring electrode 12. The particle group 14PT may contain only particles aiming to the protection function. In this case, the variable light absorbing layer 14 becomes a particle-containing layer that covers the wiring electrode 12 to protect the wiring electrode 12.

In this embodiment, the case where the titanium oxide particles P0 are dispersed in the whole variable light absorbing layer 14 has been described. However, the variable light absorbing layer 14, for example, may contain a plurality of metal oxide particles that change the light absorption property by the irradiation with the ultraviolet light LB only in at least a part of the region. For example, when the ultraviolet light LB is irradiated, among the metal oxide particles dispersed in the variable light absorbing layer 14, the metal oxide particles where the ultraviolet light LB reaches cause the oxygen loss, and thus the absorbing region 14AB is formed.

In this embodiment, the case where the variable light absorbing layer 14 includes the absorbing region 14AB and the scattering reflection region 14SC has been described. However, for example, the variable light absorbing layer 14 only needs to be configured such that the absorbing region 14AB can be formed by the irradiation with the ultraviolet light LB.

Accordingly, for example, the variable light absorbing layer 14 only needs to include the absorbing region 14AB formed in the region (for example, the first and third regions 14A and 14C) at the predetermined depth from the upper surface 14S of the variable light absorbing layer 14, and containing the plurality of metal oxide particles (for example, the titanium oxide particles P1 and P3) that have the absorbency to the light emitted from the light-emitting element 13 by the irradiation with the ultraviolet light LB.

Considering obtaining high light extraction efficiency, for example, the variable light absorbing layer 14 preferably includes the scattering reflection region 14SC disposed on the substrate 11 side (for example, the second region 14B) with respect to the absorbing region 14AB and containing the plurality of metal oxide particles (for example, the titanium oxide particles P2) having a scattering property and reflectivity to the light emitted from the light-emitting element 13.

Thus, for example, the light-emitting device 10 includes the substrate 11, the wiring electrode 12 (electrode), the light-emitting element 13, the variable light absorbing layer 14, and the sealing body 15. The wiring electrode 12 is formed on the substrate 11. The light-emitting element 13 is disposed on the substrate 11 and electrically connected to the wiring electrode 12. The variable light absorbing layer 14 is formed so as to cover the wiring electrode 12 on the substrate 11 and contains the plurality of metal oxide particles that change the light absorption property by the irradiation with an ultraviolet light LB. The sealing body 15 is formed on the substrate 11 so as to seal the light-emitting element 13. The sealing body 15 has the translucency to the light emitted from the light-emitting element 13. This allows easily adjusting the optical property after mounting and providing the light-emitting device 10 with high quality and long life.

Embodiment 2

FIG. 4A is a top view of a light-emitting device 20 according to Embodiment 2. FIG. 4B is a cross-sectional view of the light-emitting device 20. FIG. 4B is a cross-sectional view taken along the line 4B-4B in FIG. 4A. Using FIG. 4A and FIG. 4B, a configuration of the light-emitting device 20 will be described.

In this embodiment, the light-emitting device 20 includes a frame body 21 formed so as to surround the light-emitting element 13 on the substrate 11. In this embodiment, a variable light absorbing layer 22 of the light-emitting device 20 is formed in a region inside the frame body 21 on the substrate 11. In this embodiment, a sealing body 23 of the light-emitting device 20 is formed so as to bury the light-emitting element 13, the variable light absorbing layer 22, and the frame body 21 on the substrate 11.

Similarly to the variable light absorbing layer 14, the variable light absorbing layer 22 includes an absorbing region 22AB on which the titanium oxide particles P1 and P3 are dispersed at the proximity of an upper surface 22S and a scattering reflection region 22SC on which the titanium oxide particles P2 are dispersed. Additionally, the variable light absorbing layer 22 is formed on the substrate 11 so as to cover the wiring electrode 12.

The frame body 21 is disposed on the substrate 11 so as to surround the light-emitting element 13 separated from the light-emitting element 13. In this embodiment, the frame body 21 functions as a member that defines the mounting region of the light-emitting element 13 and a formation region of the variable light absorbing layer 22 on the substrate 11.

Further, the frame body 21 is made of, for example, a resin body containing titanium oxide particles at a concentration higher than that of the variable light absorbing layer 22. For example, the frame body 21 is made of silicone resin containing the titanium oxide particles P1 to P3 at a concentration of, for example, from 70 to 90 wt %, which is a concentration higher than that of the variable light absorbing layer 22.

In this embodiment, the frame body 21 functions as a member that reflects light at high reflectivity and improves efficiency of taking out the light emitted from the light-emitting element 13 from the sealing body 23. Note that the frame body 21 does not cause oxygen loss (does not turn into black) even irradiated with the ultraviolet light LB, but maintains scattering reflectivity of the visible light. The variable light absorbing layer 22 and the frame body 21 are at least different in this point.

In this embodiment, the variable light absorbing layer 22 is formed in a part of the region on the substrate 11 and the sealing body 23 is disposed so as to bury the variable light absorbing layer 22. In the light-emitting device 20 having such a sealing structure as well, the variable light absorbing layer 22 has the protection function by covering the wiring electrode 12 and the optical output adjustment function by containing the titanium oxide particles P1 to P3.

Note that the configuration of the frame body 21 is not limited to the one described above. The frame body 21 only needs to be formed on the substrate 11 so as to surround the light-emitting element 13. Additionally, the frame body 21 needs not to have the optical function, such as the light reflection function.

Thus, in this embodiment, the light-emitting device 20 includes the frame body 21 formed so as to surround the light-emitting element 13 on the substrate 11. The variable light absorbing layer 22 is formed in the region inside the frame body 21 on the substrate 11. The sealing body 23 is formed so as to bury the light-emitting element 13, the variable light absorbing layer 22, and the frame body 21 on the substrate 11. Accordingly, in the light-emitting device 20 having such a sealing structure as well, the variable light absorbing layer 22 allows easily adjusting the optical property after mounting and the light-emitting device with high quality and long life can be provided.

Embodiment 3

FIG. 5A is a top view of a light-emitting device 30 according to Embodiment 3. FIG. 5B is a cross-sectional view of the light-emitting device 30. FIG. 5B is a cross-sectional view taken along the line 5B-5B of FIG. 5A. A configuration of the light-emitting device 30 will be described using FIG. 5A and FIG. 5B.

The light-emitting device 30 includes a substrate 31 having a depressed portion 31R, a wiring electrode 32 formed on a bottom portion of the depressed portion 31R, the light-emitting element 13 disposed on the bottom portion of the depressed portion 31R, a variable light absorbing layer 34 formed on the bottom portion of the depressed portion 31R, and a sealing body 35 formed on the substrate 31 while embedding the depressed portion 31R.

In this embodiment, the substrate 31 includes a plate-shaped first base material 31A and a plate-shaped second base material 31B formed on the first base material 31A and having an opening. A part of the first base material 31A is exposed from the opening in the second base material 31B. The depressed portion 31R of the substrate 31 has a part on the first base material 31A exposed from the opening in the second base material 31B as the bottom portion. The depressed portion 31R has an inner wall of the opening in the second base material 31B as a side surface.

The substrate 31 includes a first through-electrode 31C that passes through the first base material 31A and the second base material 31B, and a second through-electrode 31D that passes through the first base material 31A. The light-emitting device 30 includes the wiring electrode 32 formed on the bottom portion of the depressed portion 31R of the substrate 31 and connected to the second through-electrode 31D, and a wiring electrode 33 formed on an outer side of the depressed portion 31R of the substrate 31 (on the second base material 31B in this embodiment) and connected to the first through-electrode 31C.

In this embodiment, the variable light absorbing layer 34 is formed in the depressed portion 31R of the substrate 31 so as to cover the wiring electrode 32. Additionally, similarly to the variable light absorbing layer 14, the variable light absorbing layer 34 includes an absorbing region 34AB, on which the titanium oxide particles P1 and P3 are dispersed at the proximity of an upper surface 34S, and a scattering reflection region 34SC, on which the titanium oxide particles P2 are dispersed. The variable light absorbing layer 34 is formed on the substrate 31 so as to cover the wiring electrode 32.

In the light-emitting device 30 having the structure thus sealed as well, disposing the variable light absorbing layer 34 on the side portion of the light-emitting element 13 allows easily adjusting the optical property after mounting. Further, deterioration of the wiring electrode 32 can be reduced.

In this embodiment, the depressed portion 31R of the substrate 31 has the side surfaces formed so as to be tapered off toward the bottom portion of the substrate 31. Accordingly, the light emitted from the light-emitting element 13 is easily reflected by the upper surface of the sealing body 35, namely, the light extraction surface. Moreover, alight in an orientation with a narrow angle is taken out by the depressed portion 31R.

Thus, in this embodiment, the substrate 31 has the depressed portion 31R forming the region to house the light-emitting element 13. The variable light absorbing layer 34 is formed so as to cover the wiring electrode 32 in the depressed portion 31R. Accordingly, in the light-emitting device 30 having such a sealing structure as well, the variable light absorbing layer 34 allows easily adjusting the optical property after mounting, and the light-emitting device with high quality and long life can be provided.

Embodiment 4

FIG. 6A is a top view of a light-emitting device 40 according to Embodiment 4. FIG. 6B is a cross-sectional view of the light-emitting device 40. FIG. 6B is a cross-sectional view taken along the line 6B-6B of FIG. 6A. A configuration of the light-emitting device 40 will be described using FIG. 6A and FIG. 6B.

In this embodiment, the light-emitting device 40 includes a substrate 41 that includes a plurality of depressed portions 41RR, 41RG, and 41RB, a plurality of wiring electrodes 42R, 42G, and 42B formed in the depressed portions 41RR, 41RG, and 41RB, respectively, and a plurality of light-emitting elements 43R, 43G, and 43B disposed in the depressed portions 41RR, 41RG, and 41RB, respectively.

The light-emitting device 40 includes a variable light absorbing layer 44 that includes a plurality of individual variable light absorbing layers 44R, 44G, and 44B formed on side portions of the light-emitting elements 43R, 43G, and 43B so as to cover the wiring electrodes 42R, 42G, and 42B in the depressed portions 41RR, 41RG, and 41RB, respectively. The light-emitting device 40 includes a sealing body 45 formed on the substrate 41 so as to seal the light-emitting elements 43R, 43G, and 43B.

First, the substrate 41 includes a plate-shaped first base material 41A and a second base material 41B formed on the first base material 41A and having a plurality of openings separated from one another. The depressed portions 41RR, 41RG, and 41RB are formed of the opening in the second base material 41B and an upper surface part of the first base material 41A exposed from this opening.

In this embodiment, the light-emitting elements 43R, 43G, and 43B emit lights having mutually different peak wavelengths. For example, the light-emitting element 43R includes a supporting substrate 43RA (not illustrated) and a semiconductor layer 43RB (not illustrated), which includes a light-emitting layer made of a phosphide-based semiconductor, and emits a light having a peak wavelength in a red region. For example, the light-emitting element 43G includes a supporting substrate 43GA and a semiconductor layer 43GB, which is made of a nitride-based semiconductor, and emits a light having a peak wavelength in a green region. For example, the light-emitting element 43B includes a supporting substrate 43BA and a semiconductor layer 43BB, which is made of a nitride-based semiconductor, and emits a light having a peak wavelength in a blue region.

The variable light absorbing layers 44 are individually formed on respective bottom portions of the depressed portions 41RR, 41RG, and 41RB. The variable light absorbing layer 44 includes the plurality of individual variable light absorbing layers 44R, 44G, and 44B that change the absorption property to the light emitted from the light-emitting elements 43R, 43G, and 43B in the depressed portions 41RR, 41RG, and 41RB by the irradiation with the ultraviolet light.

The individual variable light absorbing layer 44R contains metal oxide particles that change the absorbency to a light in the red region by the irradiation with the ultraviolet light. For example, the individual variable light absorbing layer 44R includes an absorbing region 44RAB (not illustrated), which is disposed at the proximity of an upper surface 44RS (not illustrated) and absorbs the light in the red region by the irradiation with the ultraviolet light, and a scattering reflection region 44RSC (not illustrated), which is not irradiated with the ultraviolet light but scatters and reflects the light in the red region.

Similarly, the individual variable light absorbing layer 44G includes, for example, an absorbing region 44GAB, which is disposed at the proximity of an upper surface 44GS and absorbs the light in the green region by the irradiation with the ultraviolet light, and a scattering reflection region 44GSC, which is not irradiated with the ultraviolet light but scatters and reflects the light in the green region. Additionally, the individual variable light absorbing layer 44B includes, for example, an absorbing region 44BAB, which is disposed at the proximity of an upper surface 44BS and absorbs the light in the blue region by the irradiation with the ultraviolet light, and a scattering reflection region 44BSC, which is not irradiated with the ultraviolet light but scatters and reflects the light in the blue region.

For example, in this embodiment, the individual variable light absorbing layers 44R and, 44G, and 44B each contain the titanium oxide particles P1 to P3 like the variable light absorbing layer 14, and as a result, the absorbency to the visible light including the respective wavelength regions changes.

In this embodiment, the wiring electrode 42R includes first and second wiring electrodes 42RA and 42RB. The individual variable light absorbing layer 44R is formed in the depressed portion 41RR so as to cover the first and second wiring electrodes 42RA and 42RB.

Similarly, the wiring electrode 42G includes the first and second wiring electrodes 42GA and 42GB. The individual variable light absorbing layer 44G is formed in the depressed portion 41RG so as to cover the first and second wiring electrodes 42GA and 42GB. Additionally, the wiring electrode 42B includes first and second wiring electrodes 42BA and 42BB. The individual variable light absorbing layer 44B is formed in the depressed portion 41RB so as to cover the first and second wiring electrodes 42BA and 42BB.

In this embodiment, the variable light absorbing layer 44 individually adjusts the optical outputs to the light-emitting elements 43R, 43G, and 43B that emit the different lights having the different wavelengths. Therefore, not only the output adjustment of the light taken out from the light-emitting device 40, its wavelength can also be adjusted. Accordingly, the optical output and the wavelength can be strictly adjusted after mounting. The variable light absorbing layer 44 allows firmly protecting the wiring electrodes 42R, 42G, and 42B. Therefore, the light-emitting device 40 with high quality and long life can be provided.

FIG. 7 is a top view of a light-emitting device 40A according to a modification of Embodiment 4. The light-emitting device 40A includes a substrate 41C that has a common depressed portion 41RC that houses the whole light-emitting elements 43R, 43G, and 43B. The respective wiring electrode 42R, 42G, and 42B are all formed in the depressed portion 41RC.

Further, a variable light absorbing layer 44C includes absorbing regions 44RAB, 44GAB, and 44BAB formed by being partially irradiated with the ultraviolet light in respective side portions of the light-emitting elements 43R, 43G, and 43B, and a common scattering reflection region 44CSC formed in the other region.

Like this modification, the light-emitting elements 43R, 43G, and 43B may be mounted in the common space that is not optically cut off. In this case as well, irradiating the variable light absorbing layer 44 with the ultraviolet light allows individually adjusting or batch-adjusting the outputs of the lights emitted from the respective light-emitting elements 43R, 43G, and 43B. Therefore, the output and the wavelength of the light taken out from the light-emitting device 40A can be easily adjusted after mounting. Therefore, the light-emitting device 40A with high quality and long life can be provided.

In this embodiment, the case where the light-emitting elements 43R, 43G, and 43B emit the lights having the mutually different peak wavelengths has been described. However, the configuration of the light-emitting elements 43R, 43G, and 43B is not limited to this. The light-emitting device 40 only needs to include the plurality of light-emitting elements 43R, 43G, and 43B mounted on the substrate 41.

For example, like this embodiment, in the case where the plurality of light-emitting elements 43R, 43G, and 43B that emit the lights at the mutually different wavelengths are mounted as well, the variable light absorbing layer 44 only needs to contain the plurality of metal oxide particles that change the light absorption property to at least apart of the lights emitted from the plurality of light-emitting elements 43R, 43G, and 43B by the irradiation with the ultraviolet light.

The variable light absorbing layer 44 at least only needs to be formed so as to cover the plurality of wiring electrodes 42R, 43G, and 43B on the substrate 41 and contain the plurality of metal oxide particles that change the light absorption property by the irradiation with the ultraviolet light. This allows adjusting the optical output after mounting and protecting the electrodes at the same time.

Thus, in this embodiment, for example, the light-emitting device 40 includes the substrate 41, the plurality of wiring electrodes 42R, 42G, and 42B (electrodes) formed on the substrate 41, and the plurality of light-emitting elements 43R, 43G, and 43B, which are placed side by side on the substrate 41 and electrically connected to the wiring electrodes 42R, 42G, and 42B, respectively. Moreover, the light-emitting device 40 includes the variable light absorbing layer 44, which is formed so as to cover the wiring electrodes 42R, 43G, and 43B on the substrate 41 and contains the plurality of metal oxide particles that change the light absorption property by the irradiation with the ultraviolet light, and the sealing body 45, which is formed on the substrate 41 so as to seal the plurality of light-emitting elements 43R, 43G, and 43B and has the translucency to the lights emitted from the plurality of light-emitting elements 43R, 43G, and 43B. This allows easily adjusting the optical property after mounting and providing the light-emitting device 40 with high quality and long life.

Note that, for example, when the wiring electrodes 42R, 43G, and 43B are sufficiently protected and in use under an environment where a concern of deterioration is small, the variable light absorbing layer 44 needs not to cover the wiring electrodes 42R, 43G, and 43B. That is, for example, the light-emitting device 40 may be configured considering only the adjustments of the optical output and the wavelength.

In this case, for example, it is only necessary that the light-emitting device 40 includes the substrate 41, the plurality of light-emitting elements 43R, 43G, and 43B, which are placed side by side on the substrate 41 and emit the lights at the mutually different peak wavelengths, the variable light absorbing layers 44, which are formed on the side portions of the plurality of light-emitting elements 43R, 43G, and 43B on the substrate 41 and contain the plurality of metal oxide particles that change the light absorption property to at least a part of the lights emitted from the plurality of light-emitting elements 43R, 43G, and 43B by the irradiation with the ultraviolet light, and the sealing body 45, which is formed on the substrate 41 so as to seal the plurality of light-emitting elements 43R, 43G, and 43B and has the translucency to the lights emitted from the plurality of light-emitting elements 43R, 43G, and 43B. This allows providing the light-emitting device 40 that can easily adjust the optical output and the wavelength after mounting.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2019-112524 filed on Jun. 18, 2019, the entire contents of which are incorporated herein by reference.

What is claimed is:

1. A light-emitting device comprising:
    a substrate;
    an electrode formed on the substrate;
    a light-emitting element disposed on the substrate and electrically connected to the electrode;
    a variable light absorbing layer formed so as to cover the electrode on the substrate, the variable light absorbing layer containing a plurality of metal oxide particles that change a light absorption property by irradiation with an ultraviolet light; and a sealing body formed on the substrate so as to seal the light-emitting element, the sealing body having translucency to a light emitted from the light-emitting element; wherein the variable light absorbing layer includes an absorbing region, the absorbing region is formed in a region at a predetermined depth from the upper surface of the variable light absorbing layer, the absorbing region contains the plurality of metal oxide particles, and the plurality of metal oxide particles have absorbency to the light emitted from the light-emitting element by the irradiation with the ultraviolet light.

2. The light-emitting device according to claim 1, wherein the variable light absorbing layer is formed up to an end portion of an upper surface of the substrate, and the variable light absorbing layer has a side surface exposed to an external atmosphere.

3. The light-emitting device according to claim 1, further comprising
a frame body formed so as to surround the light-emitting element on the substrate, wherein
the variable light absorbing layer is formed in a region inside the frame body on the substrate, and
the sealing body is formed so as to bury the light-emitting element, the variable light absorbing layer, and the frame body on the substrate.

4. The light-emitting device according to claim 1, wherein the plurality of metal oxide particles in the variable light absorbing layer have a property that changes a band gap by the irradiation with the ultraviolet light.

5. The light-emitting device according to claim 1, wherein the variable light absorbing layer includes a scattering reflection region, the scattering reflection region is disposed on the substrate side with respect to the absorbing region, the scattering reflection region contains the plurality of metal oxide particles, and the plurality of metal oxide particles have a scattering property and reflectivity to the light emitted from the light-emitting element.

6. The light-emitting device according to claim 1, wherein the plurality of metal oxide particles contain a plurality of titanium oxide particles or zinc oxide particles.

7. The light-emitting device according to claim 1, wherein the light-emitting element includes a supporting substrate and a semiconductor layer, and the semiconductor layer is supported by the supporting substrate and includes a light-emitting layer, and the variable light absorbing layer is formed at a height not exceeding the light-emitting layer of the light-emitting element on the substrate.

8. A light-emitting device comprising:
a substrate;
a plurality of electrodes formed on the substrate;
a plurality of light-emitting elements placed side by side on the substrate and electrically connected to the plurality of respective electrodes;
a variable light absorbing layer formed so as to cover the plurality of electrodes on the substrate, the variable light absorbing layer containing a plurality of metal oxide particles that change a light absorption property by irradiation with an ultraviolet light; and
a sealing body formed on the substrate so as to seal the plurality of light-emitting elements, the sealing body having translucency to lights emitted from the plurality of light-emitting elements; wherein
the plurality of light-emitting elements are configured to emit the lights having mutually different peak wavelengths.

9. The light-emitting device according to claim 8, wherein the plurality of metal oxide particles in the variable light absorbing layer change a light absorption property to at least a part of the lights emitted from the plurality of light-emitting elements by the irradiation with the ultraviolet light.

10. The light-emitting device according to claim 8, wherein
the substrate has a plurality of depressed portions disposed separated from one another,
the plurality of light-emitting elements are individually disposed on bottom portions of the plurality of respective depressed portions, and
the variable light absorbing layer includes a plurality of individual variable light absorbing layers, the plurality of individual variable light absorbing layers are individually formed on the bottom portions of the plurality of respective depressed portions, and the plurality of individual variable light absorbing layers change an absorption property to the lights emitted from the light-emitting elements inside the plurality of respective depressed portions by the irradiation with the ultraviolet light.

\* \* \* \* \*